United States Patent [19]

Stakhov

[11] 4,161,725
[45] Jul. 17, 1979

[54] ANALOG-FIBONACCI p-CODE CONVERTER

[76] Inventor: Alexei P. Stakhov, ulitsa Chekhova, 49, kv. 16, Taganrog, U.S.S.R.

[21] Appl. No.: 849,984

[22] Filed: Nov. 9, 1977

[51] Int. Cl.$^2$ ............................................. H03K 13/02
[52] U.S. Cl. ............................ 340/347 AD; 340/347 P
[58] Field of Search ... 340/347 AD, 347 M, 347 DD, 340/347 P

[56] References Cited

U.S. PATENT DOCUMENTS 4,032,979  6/1977  Rice ............................... 340/347 DD

OTHER PUBLICATIONS

Kautz, "IEEE Transactions on Information Theory" Apr. 1965, pp. 284–292.
Mandelbaum, "IEEE Transactions on Information Theory" vol. IT-18, No. 2, Mar. 1972, pp. 281–285.

*Primary Examiner*—Charles D. Miller
*Attorney, Agent, or Firm*—Haseltine, Lake & Waters

[57] ABSTRACT

An analog-Fibonacci p-code converter comprises a code readout device having a control input receiving a code readout pulse, as well as a device for realization of a Fibonacci p-code table having an input receiving an analog value being converted, the device being coupled to message inputs of the code readout device. The converter also comprises a device for conversion of the readout combination of binary signals which corresponds to a quantitized analog value into a minimal form of the Fibonacci p-code of the serial number of the quantitized analog value which is connected with the inputs thereof to the outputs of the code readout device corresponding to places of the Fibonacci p-code, beginning with the pth place, and the outputs of this device are message outputs of the analog-Fibonacci p-code converter which correspond to respective places of the Fibonacci p-code, beginning with the pth place. The device for conversion of the readout combination of binary signals comprises a plurality of similar functional stages for identification of a pair of neighboring unity places in the selected combination of binary signals. In addition, the analog-Fibonacci p-code converter comprises a device for checking the converted code combination of binary signals corresponding to a minimal form of the Fibonacci p-code. The checking device has its inputs connected to the outputs of the code readout device and of the device for conversion of the readout combination of binary signals, and has its output which is the check output of the analog-Fibonacci p-code converter.

6 Claims, 5 Drawing Figures

ANALOG-FIBONACCI P-CODE CONVERTER

FIELD OF THE INVENTION

The invention relates to the computation data processing and measurement technology, and more particularly, to analog-Fibonacci p-code converters, and it may he used for analogue-digital conversion, pulse-code telemetery systems, measuring systems of NC machine tools and radar stations, and digital computer input systems.

BACKGROUND OF THE INVENTION

Widely known analog-code converters comprise a device for realization of a code table having an input receiving an analog value being converted, and a code readout device having a control input receiving a code readout pulse, message inputs connected to the device for realization of a code table and an output which is the output of the converter connected to an input of a digital data processor. Depending on the type of the value being converted, the above-described system is used to make converters for conversion of linear motion, angular motion, electrical value and time interval into respective codes (cf. Digital Techniques for Computation and Control. By Martin L. Klein, Harry C. Morgan, Milton H. Arinson, Instruments Publishing Co., Pittsburgh 12. Penna.).

SUMMARY OF THE INVENTION

It is an object of the invention to provide an analog-Fibonacci p-code converter for a principally new functional purpose which enables the conversion of an analog value into Fibonacci p-code (cf. A. P. Stakhov, The Use of Natural Redundancy of Fibonacci Number Systems for Error Control of Computing Systems, Automation and Computing Machinery, No. 6, 1975, pp. 80-87 (in Russian)).

Another object of the invention is to improve the fidelity of conversion of an analog value into Fibonacci p-code by eliminating the error due to code readout ambiguity, as well as by detecting errors in the course of analog-Fibonacci p-code conversion from the form of the Fibonacci p-code appearing at the converter output.

The above objects are accomplished by that an analog-Fibonacci p-code converter comprising a code readout device having a control input receiving code readout pulse, according to the invention additionally comprises a device for realization of a Fibonacci p-code table which is in the form of an ordered sequence of n-place combinations of binary signals corresponding to minimal forms of the Fibonacci p-code of numbers from zero to $\phi_p(n)-1$, wherein $\phi_n(n)$ is the Fibonacci p-number, and two combinations of binary signals corresponding to a quantized analogue value which are located between combinations of binary signals corresponding to minimal forms of the Fibonacci p-code of numbers $N-1$ and N differing in more than one place, the first combination differing from the combination of binary signals which corresponds to a minimal form of the Fibonacci p-code of the number $N-1$ in the higher order place of non-coincident places of combinations of binary signals corresponding to a minimal form of the Fibonacci p-code of the numbers $N-1$ and N, and the second combination differing from combination of binary signals which corresponds to a minimal form of the Fibonacci p-code of the number N in the low order digit nearest to the high order digit of non-coincident digits of combinations of binary signals corresponding to a minimal form of the Fibonacci p-codes of the numbers $N-1$ and N; an input of the device for realization of the Fibonacci p-code table receiving an analog value being converted, and the device being coupled to message inputs of the code readout device; a device for conversion of the readout combination of binary signals corresponding to a respective quantized analog value into a minimal form of the Fibonacci p-code of the serial number of the quantized analog value having inputs thereof coupled to outputs of the code readout device which correspond to respective places of the Fibonacci p-code, beginning with the pth place, the outputs of the device being message outputs of the analog-Fibonacci p-code converter corresponding to respective places of the Fibonacci p-code, beginning with the pth place; the device for conversion comprising a plurality of similar functional stages for identification of a pair of neighboring unity places in the readout combination of binary signals whose number is equal to the number of places of the Fibonacci p-code, beginning with the pth place, each stage which corresponds to a place of Fibonacci p-code consisting of an AND gate having a first input connected to an ith output of the code readout device beginning with $i=p$, and a second input connected to a $(i+1)$th output of the code readout device, an OR gate having an input connected to the output of the AND gate and an output connected to a second input of the OR gate of a functional stage of the $(i-1)$th place, a NOT gate having an input connected to the output of the OR gate and an additional AND gate having a first input connected to an output of the NOT gate whose second input is connected to the first input of the first AND gate and an output which is an ith message output of the analog-Fibonacci p-code converter, beginning with $i=p$; a device for checking the converted code combination of binary signals which corresponds to a respective minimal form of the Fibonacci p-code having inputs thereof connected to the outputs of the code readout device and of the device for conversion of the readout combination of binary signals into a minimal form of the Fibonacci p-code and having an output which is a check output of the analog-Fibonacci p-code converter; the checking device comprising an OR gate having an output which is the check output of the analog-Fibonacci p-code converter, and a plurality of similar functional stages whose number is equal to the number of places of the Fibonacci p-code, beginning with the pth place; each stage which corresponds to the ith place of Fibonacci p-code consisting of an additional OR gate having p inputs which are inputs of the checking device from the $(i-1)$th to the $(i-p)$th, and an AND gate having a first input connected to an output of the second OR gate of the functional stage of the checking device another input being the ith input of the checking device (16), and an output connected to a respective input of the first OR gate.

For the conversion of a linear motion into the Fibonacci p-code, the device for realization of the Fibonacci p-code table, according to the invention, preferably comprises, a linear code mask which is mechanically coupled to a source of linear motion; the mask consisting of code areas defined by the intersection of horizontal code strips corresponding to places of the Fibonacci p-code and vertical code strips corresponding to the Fibonacci p-code of numbers from zero to $\phi_p(n)-1$ and having a pre-set channel capacity for a code readout pulse; the distribution of channel capacity for a code readout pulse of the code areas of the mask corresponding to the distribution of zeroes and unities in the Fibonacci p-code table.

For the conversion of an electrical value into the Fibonacci p-code the device for realization of Fibonacci p-code table, according to the invention, preferably comprises a cathode ray tube having an input receiving an electrical value being converted and a screen provided with a linear code mask; the code mask consisting of code areas defined by the intersection of the horizontal code strips corresponding to respective places of the Fibonacci p-code and the vertical code strips corresponding to the Fibonacci p-code of numbers from zero to $\phi_p(n)-1$ having a pre-set channel capacity for electron beam; the distribution of channel capacity for electron beam of the code areas of the mask corresponding to the distribution of unities and zeroes in the Fibonacci p-code table.

For the conversion of angular motions into the Fibonacci p-code, the device for realization of the Fibonacci p-code table, according to the invention, preferably comprises a code disc which is mechanically coupled to a source of angular motions; the code disc consisting of code areas defined by the intersection of concentric code rings corresponding to places of the Fibonacci p-code and code sectors corresponding to the Fibonacci p-code of numbers from zero to $\phi_p(n)-1$ having a pre-set channel capacity for a code readout pulse; the distribution of channel capacity for a code readout pulse of the code areas of the disc corresponding to the distribution of zeroes and unities in the Fibonacci p-code table.

In order to eliminate the error due to ambiguity of code readout from that part of the code disc which corresponds to the boundary between the code sectors corresponding to the Fibonacci p-code of the number zero and to the Fibonacci p-code of the number $\phi_p(n)-1$, according to the invention, the code disc comprises an additional concentric code ring adjoining a concentric code ring which corresponds to the high order place of the Fibonacci p-code, and three code sectors located between the code sector corresponding to the Fibonacci p-code of the number zero and the code sector corresponding to the Fibonacci p-code of the number $\phi_p(n)-1$; the code areas defined by the intersection of the additional code ring and additional code sectors having a channel capacity for a code readout pulse which corresponds to the unity value of a place of the Fibonacci p-code; the code areas defined by the intersection of the additional code ring and the remaining code sectors having a channel capacity for a code readout pulse which corresponds to the zero value of a place of the Fibonacci p-code; the distribution of channel capacity for a code readout pulse of code areas defined by the intersection of the remaining code rings and the additional code sector adjoining the code sector which corresponds to the Fibonacci p-code of the number $\phi_p(n)-1$ coinciding with the distribution of channel capacity for a code readout pulse of code areas which are defined by the intersection of the remaining code rings and the code sector which corresponds to the Fibonacci p-code of the number $100_p(n)-1$; the distribution of channel capacity for a code readout pulse of code areas defined by the intersection of the remaining code rings and the additional code sector adjoining the code sector corresponding to the Fibonacci p-code of the number zero coinciding with the distribution of channel capacity for a code readout pulse of code areas defined by the intersection of the remaining code rings and the code sector which corresponds to the Fibonacci p-code of the number zero; the distribution of channel capacity for a code readout pulse of code areas defined by the intersection of the remaining code rings and the additional code sector located between the other two additional code sectors coinciding with the distribution of channel capacity for a code readout pulse of code areas defined by the intersection of the remaining code rings and the additional code sector adjoining the code sector which corresponds to the Fibonacci p-code of the number zero, except for code areas defined by the intersection of these code sectors with the code ring corresponding to the high order place of the Fibonacci p-code.

In order to convert a time interval, the device for realization of the Fibonacci p-code table, according to the invention, preferably comprises a pulse generator generating pulses corresponding to a quantized time interval, a pulse of the beginning of the interval being fed to the input of the pulse generator and a pulse of the end of the interval serving as a code readout pulse; a zero bus connected to inputs of the code readout device corresponding to places of the Fibonacci p-code from zero to P−1; as well as a time Fibonacci p-code mask generator which comprises a plurality of similar functional stages whose number is equal to the number of places of the Fibonacci p-code, beginning with the pth place of Fibonacci p-code, each stage which corresponds to an ith place of the Fibonacci p-code consisting of a flip-flop having its unity output connected to the ith input of the code readout device, beginning with the pth input, an OR gate having an output connected to a zero set input of the flip-flop of the same functional stage, another OR gate having a first input connected to an output of a second OR gate of the functional stage of the (i-p−1)th place and an output connected to the first input of the first OR gate of the same ith functional stage, and AND gate having p+2 inputs, a first input connected to a zero input of the flip-flop of the same ith functional stage, the inputs of the gate from the 2nd to the (p−1)th being connected to zero outputs of the flip-flops of the functional stages of places from the (i+1)th to the (i+p)th, and an output connected to a complementing input of the flip-flop of the same ith functional stage and the second input of the second OR gate of the functional stage of the (i-p−2)th place, a second AND gate having a first input connected to the unity output of the flip-flop of the same ith functional stage, a second input connected to the (p+2)th input of the first AND gate of the functional stage of the (i−1)th place of the Fibonacci p-code and to the output of the second AND gate of the functional stage of the (i-p−1)th place of the Fibonacci p-code, and a pulse delay member having an input connected to the output of the first AND gate of the same ith functional stage, an output connected to the second input of the first AND gate of the functional stage of the (i−1)th place of the Fibonacci p-code, the second input of the second AND gate of the functional stage corresponding to the pth place of the Fibonacci p-code being connected to the (p+2)th input of the first AND gate of the functional stage of the same place and to the output of the pulse generator.

The analogue-Fibonacci p-code converter according to the invention enables a substantial enlargement of the field of application of "Fibonaccian" digital computers by providing an opportunity for data input in an analog form (linear and angular motions, electrical values and time intervals) to a "Fibonaccian" digital computer.

BRIEF DESCRIPTION OF THE DRAWINGS

The invention will now be described with reference to the accompanying drawings illustrating specific embodiments, in which.

DETAILED DESCRIPTION OF THE INVENTION

Figure 1:
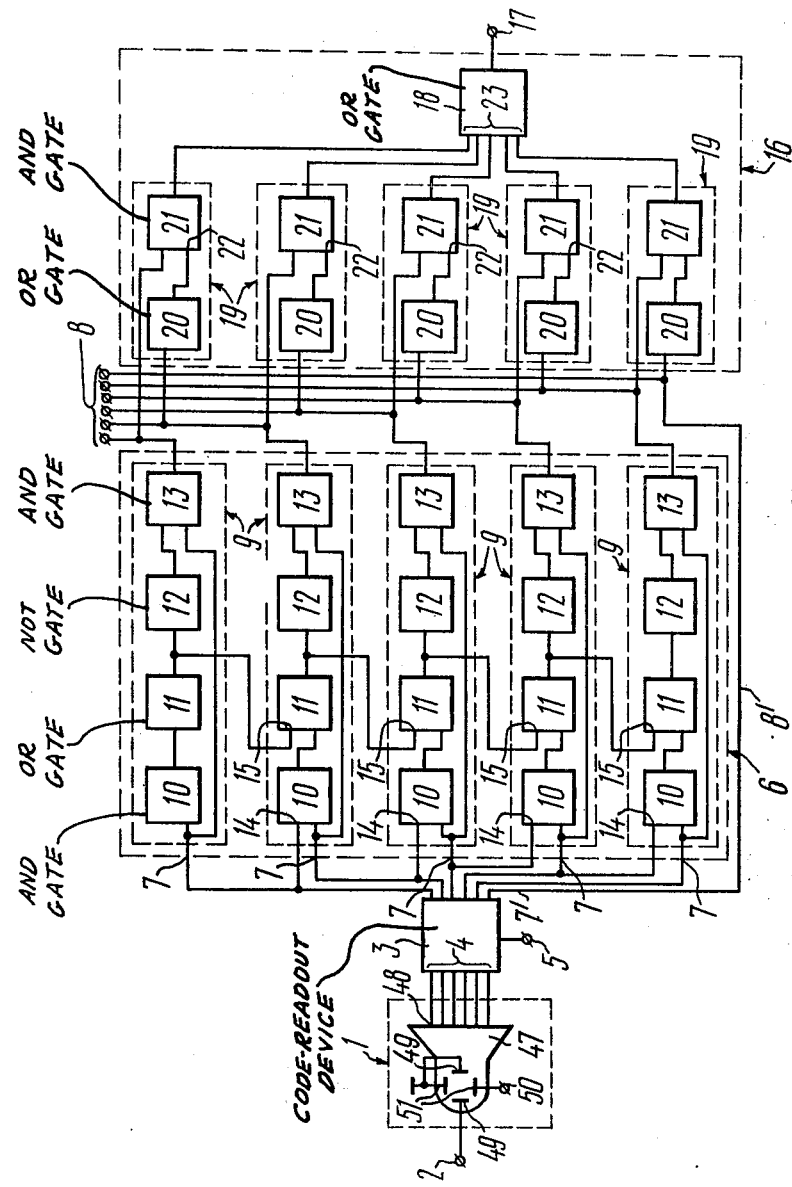
FIG. 1 is a block diagram of the analog-Fibonacci p-code converter according to the invention.

The analog-Fibonacci p-code converter with p=1 comprises a device 1 (FIG. 1) for realization of a Fibonacci p-code table having an input which is an input 2 of the converter which receives an analogue value being converted. The function of the device 1 for realization of the Fibonacci p-code table is to quantize an analog value and encode the quantized analog value in accordance with the Fibonacci p-code table which constitutes the basis for building up the device 1 for realization of the Fibonacci p-code table.

The Fibonacci p-code table comprises an ordered sequence of n-place combinations of binary signals corresponding to minimal forms of the Fibonacci p-code of numbers from zero to $\phi_p(n)-1$, wherein $\phi_p(n)$ is the Fibonacci p-number. In case minimal forms of the Fibonacci p-code for neighboring numbers N−1 and N differ in more than one place, there is always such high order place with the number 1 in the minimal forms of the Fibonacci p-code which is referred to as a critical place in which codes do not coincide. The following cases may occur in this situation:

(1) the value of the Fibonacci p-code in the critical (1th) place of greater number N is always equal to 1;

(2) the value of the Fibonacci p-code in the (l−1)th place of smaller number n−1 is always equal to 1;

(3) the values of the Fibonacci p-code in places from zero to the (l−1)th of the number N are always equal to zero.

Two code combinations are located between two minimal forms of the Fibonacci p-code of the neighboring numbers N−1 and N differing in more than one place. The first combination N' differs from the minimal form of the Fibonacci p-code of the number N−1 in the critical (1th) place, and the second combination N" differs from the minimal form of the Fibonacci p-code of the number N in the low order place [(l−1)th] nearest to the critical place (1th).

Thus, with p=1, between mimimal forms of the Fibonacci 1-code of the neighboring numbers

| | 9 | 8 | 7 | 6 | 5 | 4 | 3 | 2 | 1 | 0 |
|---|---|---|---|---|---|---|---|---|---|---|
| 33= | 0 | 0 | 1 | 0 | 1 | 0 | 1 | 0 | 1 | 0 |
| 34= | 0 | 1 | 0 | 0 | 0 | 0 | 0 | 0 | 0 | 0 | and there are inserted code combinations N' and N":

| | 9 | 8 | 7 | 6 | 5 | 4 | 3 | 2 | 1 | 0 | - places |
|---|---|---|---|---|---|---|---|---|---|---|---|
| N−1=33= | 0 | 0 | 1 | 0 | 1 | 0 | 1 | 0 | 1 | 0 | |
| N'= | 0 | 1 | 1 | 0 | 1 | 0 | 1 | 0 | 1 | 0 | |
| N"= | 0 | 1 | 1 | 0 | 0 | 0 | 0 | 0 | 0 | 0 | |
| N=34= | 0 | 1 | 0 | 0 | 0 | 0 | 0 | 0 | 0 | 0 | | wherein the seventh place is the critical place (enclosed in a square). The code combinations N' and N" correspond to the quantized analog value N=34.

In addition, the converter comprises a code readout device 3 having message inputs 4 thereof coupled to the device 1 for realization of the Fibonacci p-code table. A control input 5 of the device 3 is the input 5 of the converter which receives a code readout pulse. The device 3 is designed for code readout from the device 1. The number of the message inputs 4 and the number of the message outputs of the device 3 are equal to the number of places in the Flbonacci p-code. In this case, p=1, and the number of the message inputs 4 and the number of the message outputs of the device 3 are each equal to six.

The converter also comprises a device 6 for conversion of the readout combination of binary signals corresponding to the quantized analog value into a minimal form of the Fibonacci p-code of the serial number of the quantized analogue value. The device 6 has inputs 7 thereof connected to respective outputs of the code readout device 3 corresponding to places of the Fibonacci p-code beginning with the pth place. Outputs 8 of the device 6 are message outputs 8 of the converter. The number of the message inputs 7 and the number of the message outputs 8 of the device 6 are each equal to the number of places in the Fibonacci p-code beginning with the pth place. The device 6 comprises five similar functional stages 9 whose number is equal to the number of the remaining laces of the Fibonacci code, beginning with the pth place, in this case, beginning with p=1. The functional stage 9 is designed for identification of a group of neighboring unity digits in the readout code combination of binary signals. Each functional stage 9 corresponding to an ith digit, wherein i=1,2,3,4,5, comprises a first AND gate 10. A first input of the AND gate 10 is an ith (i=1,2,3,4,5) input 7 of the device 6 connected to the ith (i=1,2,3,4,5) output of the code readout device 3.

Furthermore, the functional stage 9 comprises an OR gate 11. A first input of the OR gate 11 is connected to the output of the first AND gate 10. The functional stage 9 also comprises a NOT gate 12 having a first input connected to the output of the OR gate 11. The functional stage 9 comprises a second AND gate 13 having a first input connected to the output of the NOT gate 12 and a second input which is the ith (i=1,2,3,4,5) input of the device 6. The output of the second AND gate 13 is the ith (i=1,2,3,4,5) output 8 of the device 6. Furthermore, the functional stages 9 are interconnected in the following manner. A second input 14 of the first AND gate 10 of the functional stage 9 corresponding to the ith (i=1,2,3,4,5) place of the code is the (i=1)th (i=1,2,3,4,5) input 7 of the device 6. There is no second input 14 of the first AND gate 10 of the functional stage 9 corresponding to the fifth or the high order place of the code in the converter described herein with −−=1, since the number of places of the Fibonacci 1-code is equal to six in this particular case. The AND gate 10 itself of the functional stage represents a channel for a pulse fed to a respective input 7. The output of the OR gate 11 of the functional stage 9 corresponding to the ith (i=1,2,3,4,5) place of the code is connected to a second input 15 of the OR gate 11 of the functional stage 9 corresponding to (i−1)th (i=2,3,4,5) place of the code. For instance, the output of the OR gate 11 of the functional stage 9 of the third place is connected to the second input 15 of the OR gate 11 of the functional stage 9 of the second place.

The analog-Fibonacci p-code converter also includes a device 16 for checking the converted code combination of binary signals as to compliance with the minimality criterion of the Fibonacci p-code. The number of message inputs of the device 16 is equal to the number of places in the Fibonacci p-code. In this particular case, where p=1, the number of inputs is six for the analog-Fibonacci 1-code converter described herein. The device 16 has its inputs connected to respective outputs 8 of the device 6 and to the outputs of the device 3. The output of the device 16 is a check output 17 of the converter. The device 16 comprises a first OR gate 18 having its output which is the output 17 of the device 16. The device 16 also includes five similar functional stages 19 whose number is equal to the number of places of the Fibonacci p-code beginning with the pth place, in this case, beginning with the 1st place. One of the functional stages 19 corresponds to the pth place of the Fibonacci p-code, wherein p=1, and the remaining four stages correspond to the remaining four places of the Fibonacci p-code. Each of the functional stages 19 is designed for checking the presence of at most one unity place in a respective group of p+1 sequentially appearing places in the minimal form of the Fobonacci p-code of the value being converted. The functional stage 19 corresponding to the ith place (i=1,2,3,4,5) of the Fibonacci p-code comprises a second OR gate 20 having p inputs, wherein p=1. The inputs of the OR gate 20 are inputs of the device 16 for checking the converted code combination of binary signals, from the (i−1)th to (i−p)th, respectively. With p=1, the OR gate 20 of the ith stage has only one input which is the (i−1)th input of the device 16 and functions as channel for a pulse.

In addition, the functional stage 19 of the ith place comprises an AND gate 21 having its first input which is the ith (i=1,2,3,4,5) input of the device 16. A second input 22 of the AND gate 21 is connected to the output of the second OR gate 20. The output of the AND gate 21 is connected to a respective input 23 of the first OR gate 18.

Figure 2:
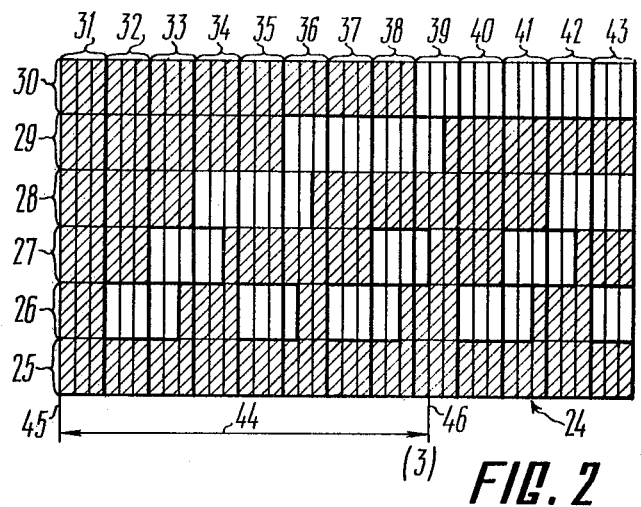
FIG. 2 is a plan view of a linear code mask for the Fibonacci 1-code, according to the invention.

For conversion of linear motions into a Fibonacci p-code, the device 1 for realization of the Fibonacci p-code table comprises a linear code mask 24 (FIG. 2).

In this case, with p=1, the Fibonacci 1-code table comprises:

|      | 5 | 4 | 3 | 2 | 1 | 0 |
|------|---|---|---|---|---|---|
| 0 =  | 0 | 0 | 0 | 0 | 0 | 0 |
| 1 =  | 0 | 0 | 0 | 0 | 1 | 0 |
| 2' = | 0 | 0 | 0 | 1 | 1 | 0 |
| 2" = | 0 | 0 | 0 | 1 | 1 | 0 |
| 2 =  | 0 | 0 | 0 | 1 | 0 | 0 |
| 3' = | 0 | 0 | 1 | 1 | 0 | 0 |
| 3" = | 0 | 0 | 1 | 1 | 0 | 0 |
| 3 =  | 0 | 0 | 1 | 0 | 0 | 0 |
| 4 =  | 0 | 0 | 1 | 0 | 1 | 0 |
| 5' = | 0 | 1 | 1 | 0 | 1 | 0 |
| 5" = | 0 | 1 | 1 | 0 | 0 | 0 |
| 5 =  | 0 | 1 | 0 | 0 | 0 | 0 |
| 6 =  | 0 | 1 | 0 | 0 | 1 | 0 |
| 7' = | 0 | 1 | 0 | 1 | 1 | 0 |

-continued

|       |   |   |   |   |   |   |
|-------|---|---|---|---|---|---|
| 7 =   | 0 | 1 | 0 | 1 | 0 | 0 |
| 8' =  | 1 | 1 | 0 | 1 | 0 | 0 |
| 8" =  | 1 | 1 | 0 | 0 | 0 | 0 |
| 8 =   | 1 | 0 | 0 | 0 | 0 | 0 |
| 9 =   | 1 | 0 | 0 | 0 | 1 | 0 |
| 10' = | 1 | 0 | 0 | 1 | 1 | 0 |
| 10" = | 1 | 0 | 0 | 1 | 1 | 0 |
| 10 =  | 1 | 0 | 0 | 1 | 0 | 0 |
| 11' = | 1 | 0 | 1 | 1 | 0 | 0 |
| 11" = | 1 | 0 | 1 | 1 | 0 | 0 |
| 11 =  | 1 | 0 | 1 | 0 | 0 | 0 |
| 12 =  | 1 | 0 | 1 | 0 | 1 | 0 |

The code mask 24 (FIG. 2) consists of code areas defined by the intersection of horizontal code strips 25, 26, 27, 28, 29, 30 and vertical code strips 31, 32, 33, 34, 35, 36, 37, 38, 39, 40, 41, 42, 43. Each of the horizontal code strips 25, 26, 27, 28, 29, 30 corresponds to a predetermined place of the Fibonacci 1-code, and each of the vertical code strips 31, 32, 33, 34, 35, 36, 37, 38, 49, 40, 41, 42, corresponds to a predetermined number of a quantized analog value beginning with zero and to the number $\phi_p(n)-1$ inclusive, wherein n is code capacity, and $\phi_p(n)$ is the Fibonacci p-number. The code areas have a pre-set channel capacity for a code readout pulse. The distribution of channel capacity for a code readout pulse of the code areas corresponds to the distribution of zeroes and unities in the Fibonacci p-code table. In this case, the example is given for realization of the code mask for a six-place Fibonacci 1-code. One of the horizontal code strips 25 (the lowest one) corresponds to the low order (zero) place of the Fibonacci 1-code, and one of the horizontal code strips 30 (the upmost one) corresponds to the higher order (fifth) place of the Fibonacci 1-code. The vertical code strip 31 corresponds to the quantized analog value with the number zero. The vertical code strip 43 corresponds to the quantized analogue value with the number twelve.

Hatched coded areas have a channel capacity for a code readout pulse corresponding to the zero signal in a respective place of the Fibonacci p-code, that is, they do not gate a code readout pulse through. Unhatched code areas have a channel capacity for a code readout pulse corresponding to the unity signal in a respective place of the Fibonacci p-code, that is they gate a code readout pulse through. Each vertical code strip is divided into three vertical portions: left-had, middle and right-hand portions. The distribution of hatched and unhatched code areas of the right-hand portion of the vertical code strip which corresponds to the quantized analog value having a number N=0,1,2,3,4,5,6,7,8,9,10,11,12 corresponds to the distribution of zeroes and unities, respectively, in the minimal form of the Fibonacci 1-code of the number N (N=0,1,2,3,4,5,6,7,8,9,10,11,12). In case the minimal form of the number N (N=1,2,3,4,5,6,7,8,9,10,11,12) differs from the minimal form of the neighboring number N=1 (N−1=0,1,2,3,4,5,6,7,8,9,10,12) in one place only, the distribution of the hatched and unhatched code areas of the left-hand and middle portions of the vertical code strip which correspond to the quantized analog value with the number N (N=0,1,2,3,4,5,6,7,8,9,10,11,12) coincides with the distribution of the hatched and unhatched code areas of the right-hand portion of this vertical code strip. In this particular case, these vertical code strips are the code strips 31, 32, 35, 37, 40, 43 corresponding to the numbers N=0,1,4,6,9,12. Otherwise, the distribution of the hatched and unhatched code areas in the left-hand portion of the vertical code strip corresponds to the distribution of zeroes and unities in the code combination of the N' type which has been inserted for compilation of the Fobonacci p-code table, and the distribution in the meddle portion corresponds to the distribution of zeroes and unities of the code combination of the N" type of the Fibonacci p-code table. In this particular case, these vertical code strips are the code strips 33, 34, 36, 38, 39, 41, 42 corresponding to the numbers N=2,3,5,7,8,10,11. The linear code mask 24 is mechanically coupled to a source of linear motion (not shown in FIG. 2). A linear motion to be converted into a Fibonacci p-code is a distance 44 from an origin 45 to a reference line 46. The code readout device 3 (FIG. 1) is rigidly connected to the reference line 46 which moves relative to the origin 45 in accordance with the linear motion being converted.

In case of conversion of linear motion into the Fibonacci p-code, the device 3 is designed for readout of the code which is used as the basis for building up the code mask 24 (FIG. 2), and this device may be constructed by known methods. Depending on the physical concept of operation of the device 3, the device 3 may be connected to the device 1 by means of electrical, electronical, optical, laser or electromagnetic coupling.

For conversion of electrical values into a Fibonacci p-code, the device 1 (FIG. 1) for realization of the Fibonacci p-code table comprises a cathode ray tube 47 (FIG. 1) having a screen 48 provided with the linear code mask 24 (FIG. 2). An electrical value being converted is fed to one of the deflection yokes 49 (FIG. 1) which deflects electron beam (horizontal yoke in this case). A linear electric an signal is fed to an input 50 of another deflection yoke 51 (vertical yoke in this case).

The code readout device 3 of the converter designed for conversion of an electrical value into the Fibonacci p-code may be of an appropriate known construction. The device 3 is designed for readout of the code which is used as the basis for building up the linear code mask 24 (FIG. 2) and for the conversion of a sequence of binary signals appearing at the output of the cathode ray tube 47 into the readout combination of binary signals appearing at the outputs of the device 3.

Figure 3:
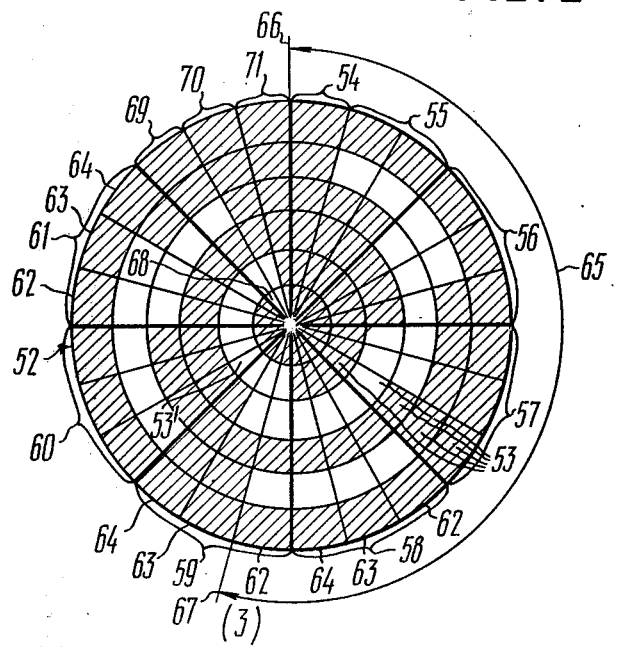
FIG. 3 is a plan view of a code disc for the Fibonacci 1-code, according to the invention.

For the conversion of angular motions into a five-place Fibonacci p-code with p=1, the device 1 (FIG. 1) for realization of the Fibonacci p-code table with p=1 comprises a code disc 52 (FIG. 3).

The code disc 52 is based on the following Fibonacci 1-code table:

|      | 4 | 3 | 2 | 1 | 0 | - places |
|------|---|---|---|---|---|----------|
| 0 =  | 0 | 0 | 0 | 0 | 0 |          |
| 1 =  | 0 | 0 | 0 | 1 | 0 |          |
| 2' = | 0 | 0 | 1 | 1 | 0 |          |
| 2" = | 0 | 0 | 1 | 1 | 0 |          |
| 2 =  | 0 | 0 | 1 | 0 | 0 |          |
| 3' = | 0 | 1 | 1 | 0 | 0 |          |
| 3" = | 0 | 1 | 1 | 0 | 0 |          |
| 3 =  | 0 | 1 | 0 | 0 | 0 |          |
| 4 =  | 0 | 1 | 0 | 1 | 0 |          |
| 5 =  | 1 | 1 | 0 | 1 | 0 |          |
| 5 =  | 1 | 1 | 0 | 0 | 0 |          |
| 5 =  | 1 | 0 | 0 | 0 | 0 |          |
| 6 =  | 1 | 0 | 0 | 1 | 0 |          |
| 7' = | 1 | 0 | 1 | 1 | 0 |          |
| 7" = | 1 | 0 | 1 | 1 | 0 |          |
| 7 =  | 1 | 0 | 1 | 0 | 0 |          |

The code disc 52 consists of code areas defined by the intersection of concentric code rings 53 and code sectors 54,55,56,57,58,59,60,61. Each code ring 53 corresponds to a predetermined place of the Fibonacci p-code, and each code sector 54,55,56,57,58,59,60,61 corresponds to a predetermined number of quantized angular motion. The code areas have a pre-set channel capacity for a code readout pulse. The distribution of channel capacity for a code readout pulse of the code areas corresponds to the distribution of zeroes and unities in the Fibonacci p-code table, wherein p=1. The hatched code aread of the code disc 52 have a channel capacity for a code readout pulse which corresponds to a zero signal in a respective place of the Fibonacci p-code, that is they do not gate a code readout pulse through. The unhatched code areas have a channel capacity for a code readout pulse which corresponds to a unity signal in a respective place of the Fibonacci p-code, that is they gate a code readout pulse through. In this particular case, the code ring 53 which is remotest from the center of the disc 52 corresponds to the low order (zero) place of the Fibonacci p-code, the code sector 54 corresponds to the quantized angular motion with the number zero. The code sector 55 corresponds to the quantized angular motion with the number one. The code sector 61 corresponds to the quantized angular motion with the number 7. Each code sector 56, 57, 58, 59, 60, 61 is divided into three subsectors 62, 63, 64. The subsector 63 is an intermediate subsector located between the subsectors 62 and 64, and the subsectors 64 of the Nth (N=2,3,4,5,6) code sectors 56,57,58,59,60 adjoin the subsectors 62 of the neighboring (N+1)th sectors 57,58,59,60,61, respectively.

The distribution of channel capacity for a code readout pulse of the hatched and unhatched code areas defined by the intersection of all rings 53 and subsectors 64 of the sectors 56,57,58,59,60,61 corresponds to the distribution of zeroes and unities in the minimal form of the Fibonacci p-code of the number N, wherein N=2,3,4,5,6,7. In case the minimal form of the number N, wherein N=2,3,4,5,6,7, differs from the minimal form of the number N−1, wherein N−1=1,2,3,4,5,6 in one place only, the distribution of channel capacity for a code readout pulse of the hatched and unhatched code areas defined by the intersection of the rings 53 and the subsectors 62 and 63 of the Nth (N=2,3,4,5,6,7) sectors 55, 56,57, 58, 59,60,61 coincides with the distribution of channel capacity for a code readout pulse of the hatched and unhatched code areas defined by the intersection of the code rings 53 and the subsector 63 of the Nth sector. In this particular case, these are the code sectors 58 and 60. Otherwise, the distribution of channel capacity for a code readout pulse of the hatched and unhatched code areas defined by the intersection of the rings 53 and subsectors 62 of the Nth (N=2,3,4,5,6,7) sectors 56,57,58, 59,60,61 corresponds to the distribution of zeroes and unities in a respective code combination of the N' type in the Fibonacci p-code table. The distribution of channel capacity for a code readout pulse of the code areas defined by the intersection of the rings 53 and the subsectors of the Nth (N=2,3,4,5,6,7) sectors 56,57,58,49,60,61 corresponds to the distribution of zeroes and unities in a respective code combination of the N" type in the Fibonacci p-code table. In this particular case, these are the code sectors 56, 57, 61. An angular motion to be converted into the Fibonacci p-code is an angle 65 between an origin 66 and a reference line 67. The code readout device 3 (FIG. 1) is rigidly connected to the reference line 67 which moves relative to the origin 66 in accordance with the angular motion being converted.

In order to eliminate the error due to code readout ambiguity at the boundary between the code sector 54 corresponding to the Fibonacci p-code of the quantized analog value with the number zero, and the code sector 61 corresponding to the quantized analog value with the number N=7 (in case of any p, N=$\phi_p(n)-1$, wherein $\phi_p(n)$ is the Fibonacci p-number), the code disc 52 has an additional concentric code ring 68 adjoining a concentric code ring 53' corresponding to the high order (fourth) place of the Fibonacci p-code, with p=1. Furthermore, there are additionally provided three code sectors 69, 70, 71 located between the code sectors 61 and 54. The code areas defined by the intersection of the additional code ring 68 and the additional code sectors 69, 70, 71 have a channel capacity for a code readout pulse corresponding to the unity signal in a place of code, that is they gate a code readout pulse through. The code areas defined by the intersection of the additional code ring 68 and all remaining code sectors 54, 55, 56, 57, 58, 59, 60, 61 have a channel capacity for a code readout pulse corresponding to the zero signal in a place of code, that is they do not gate a code readout pulse through. The distribution of channel capacity for a code readout pulse of the code areas defined by the intersection of the remaining code rings 53 and the additional code sector 69 coincides with the distribution of channel capacity for a code readout pulse of the code areas defined by the intersection of the remaining code rings 53 and the subsector 64 of the code sector 61 corresponding to the Fibonacci p-code with p=1 of the number seven (in case of any p, of the number $\phi_p(n)-1$). The distribution of channel capacity for a code readout pulse of the code areas defined by the intersection of the remaining code rings 53 and the additional code sector 71 coincides with the distribution of channel capacity for a code readout pulse of the code areas defined by the intersection of the remaining code rings 53 and the code sector 54 corresponding to the Fibonacci p-code of the number zero. The distribution of channel capacity for a code readout pulse of the code areas defined by the intersection of the remaining code rings 53 and the additional code sector 70 coincides with the distribution of channel capacity for a code readout pulse of the code areas defined by the intersection of the remaining code rings 53 and the additional code sector 71, except for the code areas defined by the intersection of the code ring 53' corresponding to the high order (fourth) place of the Fibonacci p-code with p=1 and additional code sectors 70, 71.

As a result of the provision of the additional code ring 68 and three additional code sectors 69, 70, 71, the code disc 52 realizes the following code table:

|       | 5 | 4 | 3 | 2 | 1 | 0 | places |
|-------|---|---|---|---|---|---|--------|
| 0'=   | 0 | 1 | 0 | 1 | 0 | 0 |        |
| 0''=  | 1 | 1 | 0 | 0 | 0 | 0 |        |
| 0'''= | 1 | 0 | 0 | 0 | 0 | 0 |        |
| 0 =   | 0 | 0 | 0 | 0 | 0 | 0 |        |
| 1 =   | 0 | 0 | 0 | 0 | 1 | 0 |        |
| 2'=   | 0 | 0 | 0 | 1 | 1 | 0 |        |
| 2''=  | 0 | 0 | 0 | 1 | 1 | 0 |        |
| 2 =   | 0 | 0 | 0 | 1 | 0 | 0 |        |
| 3'=   | 0 | 0 | 1 | 1 | 0 | 0 |        |
| 3''=  | 0 | 0 | 1 | 1 | 0 | 0 |        |
| 3 =   | 0 | 0 | 1 | 0 | 0 | 0 |        |
| 4 =   | 0 | 0 | 1 | 0 | 1 | 0 |        |
| 5'=   | 0 | 1 | 1 | 0 | 1 | 0 |        |
| 5''=  | 0 | 1 | 1 | 0 | 0 | 0 |        |
| 5 =   | 0 | 1 | 0 | 0 | 0 | 0 |        |
| 6 =   | 0 | 1 | 0 | 0 | 1 | 0 |        |
| 7'=   | 0 | 1 | 0 | 1 | 1 | 0 |        |
| 7''=  | 0 | 1 | 0 | 1 | 1 | 0 |        |
| 0'=   | 1 | 1 | 0 | 1 | 0 | 0 |        |

The fifth place herein is an additional place corresponding to the additional code ring 68, and the code combination 0', 0'', 0''' correspond to the additional code sectors 69, 70, 71. The code combination seven corresponding to the subsector 64 of the sector 61 is neighboring with the code combination 0' corresponding to the additional code sector 69 as shown by arrow in the code table.

In case of conversion of angular motion into the Fibonacci p-code, the device 3 (FIG. 1), is designed for readout of code which is used as the basis for building up the code disc 52 (FIG. 3) and may be of an appropriate known type. Depending on physical concept of the operation of the device 3 (FIG. 1), the device 3 may be connected to the device 1 by an electrical, electronical, optical, laser or electromagnetic coupling.

Figure 4:
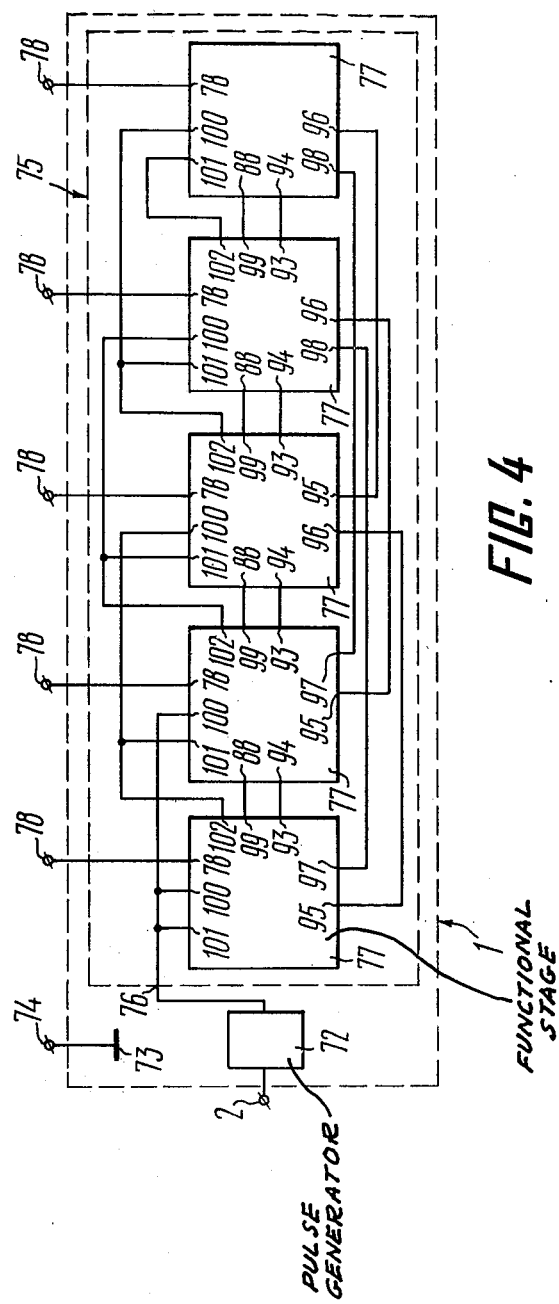
FIG. 4 is a functional diagram of the device for realization of code table for the Fibonacci 1-code in case of conversion of a time interval into the Fibonacci 1-code, according to the invention.

For conversion of a time interval into the Fibonacci p-code, the device 1 for realization of the Fibonacci p-code table comprises a pulse generator 72 (FIG. 4) for generating pulses corresponding to a quantized time interval. The input of the pulse generator 72 is the input 2 of the analog Fibonacci p-code converter, which receives a pulse of the beginning of a time interval.

Figure 5:
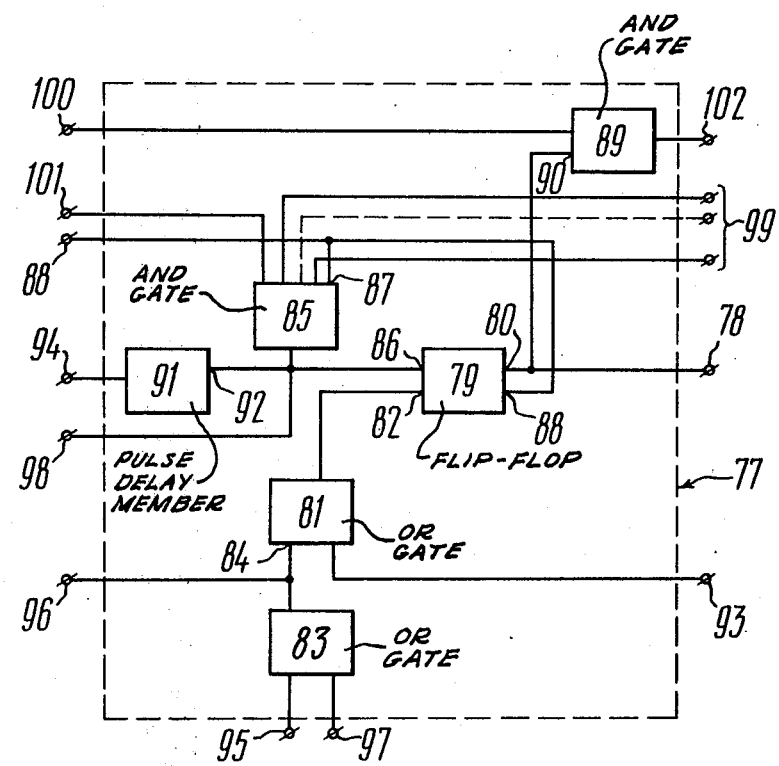
FIG. 5 is a functional diagram of a functional stage of time Fibonacci p-code mask generator, according to the invention.

The device 1 also includes a zero bus 73 forming an output 74 of the device 1 connected to the inputs 4 (FIG. 1) of the code readout device 3 from 0 to the (p−1)th. In addition, the device 1 comprises a time Fibonacci p-code mask generator 75 (FIG. 4) having an input 76 connected to the output of the pulse generator 72. The generator 75 comprises a plurality of similar functional stages 77 whose number is equal to the number of places of the Fibonacci p-code beginning with the pth place. One of the functional stages 77 corresponds to the pth place of the Fibonacci p-code with p=1, and its message output 78 which is the message output 78 of the device 1 for realization of the Fibonacci p-code table is connected to the pth input 4 (FIG. 1) of the code readout device 3. The remaining four stages 77 (FIG. 4) correspond to the (p+1)th, (p+2)th, (p+3)th and (p+4)th places of the Fibonacci p-code with p=1, and their message outputs 78 are connected to the (p+1)th, (p+2)th, (p+3)th and (p+4)th inputs 4 (FIG. 1) of the device 3. Each functional stage 77 (FIG. 4) is designed for counting pulses in the Fibonacci p-code and consists of a flip-flop 79 (FIG. 5) having a unity output 80 which is the message output 78 (FIG. 4) of the respective functional stage 77 of the time Fibonacci p-code mask generator 75. Furthermore, each stage 77 comprises a first OR gate 81 (FIG. 5) having an output connected to a zero set input 82 of the flip-flop 79, as well as a second OR gate 83 having an output connected to the first input 84 of the first OR gate 81. The stage 77 also comprises a first AND gate 85 having p+2 inputs (three inputs with p=1). An output of the first AND gate 85 is connected to a complementing input 86 of the flip-flop 79. A first input 87 of the first AND gate 85 is connected to a zero output 88 of the flip-flop 79. The stage 77 also comprises a second AND gate 89 having a first input 90 connected to a unity output 80 of the flip-flop 79. The stage 77 also includes a pulse delay member 91 having an input 92 connected to the output of the first AND gate 85. The pulse delay member 91 is designed for delaying a pulse arriving to the input 92 thereof by a time $\tau$. The following connections are arranged between the stages 77 corresponding to different places of the Fibonacci p-code, beginning with the pth place. In general case, with any given p, an input 93 (FIG. 4 and FIG. 5) of the first OR gate 81 of the stage 77 of an ith place, wherein $i=p+1, p+2, \ldots n-1$ (n is number of places of the Fibonacci p-code), is connected to an output 94 of the pulse delay member 91 of the functional stage 77 of the (i+1)th place. In addition, a first input 95 of the second OR gate 83 of the functional stage 77 of the ith place is connected to an output 96 of the second OR gate 83 of the functional stage 77 of the (i+p+1)th place. A second input 97 of the second OR gate of the functional stage 77 of the ith place is connected to an output 93 of the first AND gate 85 of the functional stage 77 of the (i+p+2)th place. Inputs 99 of the first AND gate 85 of the functional stage 77 of the ith place, from the 2nd to the (p+1)th, are connected to the zero outputs 88 of the flip-flops 79 respectively, of the functional stages 77 of respective places of the Fibonacci p-code, from (i+1)th to the (i+p)th. A second input 100 of the second AND gate 89 of the functional stage 77 of the ith place is connected to the (p+2)th input 101 of the first AND gate 85 of the functional stage of the (i−1)th place and to an output 102 of the second AND gate 89 of the functional stage of the (i−p−1)th place. The second input 100 of the second AND gate 89 of the functional stage 77 of the pth place is connected to the (p+2)th input 101 of the first AND gate 85 of the same functional stage 77 and is the input 76 of the generator 75, which is connected to the output of the pulse generator 72. In this particular case, with $p=1$, the time Fibonacci p-code mask generator 75 comprises five functional stages 77 corresponding to the first, second, third, fourth and fifth places of the Fibonacci 1-code. The following connections are arranged between the stages 77. The inputs 100 and 101 of the stage 77 of the first place are connected to the inputs 100 of the stage 77 of the second place and are the input 76 of the generator 75 receiving pulses from the pulse generator 72. Outputs 102 of the stages 77 of the first, second and third places are connected to the inputs 101 of the stages 77 of the second, third and fourth places, respectively, as well as to the inputs 100 of the stages 77 of the third, fourth and fifth places, respectively. The output 102 of the stage 77 of the fourth place is connected to the input 101 of the stage 77 of the fifth place. The outputs 96 of the stages 77 of the fifth, fourth and third places are connected to the inputs 95 of the stages 77 of the third, second and first places, respectively. The outputs 98 of the stages 77 of the fifth, and fourth places are connected to the inputs 95 of the stages 77 of the second and first places, respectively. The outputs 88 of the stages 77 of the second, third, fourth and fifth places are connected to the inputs 99 of the stages 77 of the first, second, third and fourth places, respectively, and the outputs 94 of the stages 77 of the second, third, fourth and fifth places are connected to the inputs 93 of the stages 77 of the first, second, third and fourth places, respectively. The outputs 98 of the stages 77 of the fifth and fourth places are connected to the inputs 97 of the stages 77 of the second and first places, respectively.

In case of conversion of a time interval into the Fibonacci p-code, the device 3 (FIG. 1) is designed for readout of code from the outputs of the device 1 and may be constructed, e.g., in the form of a plurality of gates whose number is equal to the number of places in the Fibonacci p-code, the inputs of the gates being the inputs 4 of the device 3 and the other inputs being interconnected and forming the input 5 of the converter receiving a signal of the end of the time interval being converted, and the outputs are the outputs of the device 3.

The analog-Fibonacci p-code converter described above functions in the following manner with $p=1$.

An analog value being converted is fed, via the input 2 (FIG. 1) of the converter, to the input of the device 1 for realization of the Fibonacci p-code table. The analog value being converted is quantized and encoded in the device 1. During conversion of a linear motion into the Fibonacci p-code by means of the linear code mask 24 (FIG. 2), the linear motion 44 being converted is quantized with respect to the level, and a certain code combination of the Fibonacci 1-code table used for building up the linear code mask 24 is set in correspondence with each quantized linear motion with a number N, wherein $N=0,1,2,3,4,5,6,7,8,9,10,11,12$. In this case, where the reference line 46 is within the code strip 39, a linear motion with the number $N=8$ corresponds to the linear motion 44 being converted.

A code combination of binary signals is read out from the device 1 by means of the device 3 (FIG. 1) upon feeding a code readout pulse to the input 5. Thus, a readout combination of binary signals appears at the outputs of the device 3.

Due to the specific structure of the Fibonacci p-code table, code combinations of two types may appear at the output of the device 1. The first type includes code combinations which are the minimal form of the Fibonacci p-code and in which no more than one unity signal appears in any group of p+1 sequentially arranged code places. The second type includes code combinations of the type N′ or N″ in the Fibonacci p-code table, that is such code combinations in which only one pair of neighboring places with unity value occurs.

During conversion of a linear motion into the Fibonacci p-code, the code combinations of the first type appear at the output of the device 1 in cases where the reference line 46 (FIG. 2) related to the linear motion 44 intersects any left-hand, right-hand or middle portion of the vertical code strips 31, 32, 35, 37, 40, 43, as well as any of the right-hand portions of all vertical code strips 31, 32, 33, 34, 35, 36, 37, 38, 39, 40, 41, 42, 43. In all the remaining cases, code combinations of the second type appear at the output of the device 1.

The code readout device 3 (FIG. 1) reads out a code combination from the device 1 and transmits the readout code combination of binary signals to the inputs 7 of the device 6 for the conversion of the readout code combination into a minimal form of the Fibonacci p-code. An error may arise due to an ambiguous readout of code from the device 1 for realization of the Fibonacci 1-code table. This error in the code mask 24 considered herein (FIG. 2) may only appear in case where the reference line is at the boundary between the left-hand and middle portions of those vertical code strips 31, 32, 33, 34, 35, 36, 37, 38, 39, 40, 41, 42, 43 which differ in their code areas in more than one place. Upon appearance at the output of the code readout device 3 (FIG. 1) of a code and a combination of binary signals of the first type, this combination of binary signals is fed to the input of the device 6 for the conversion of the readout code combination of binary signals into a minimal form of the Fibonacci p-code of the serial number of the quantitized analogue value. A zero digit signal from the zero output 7' of the device 3 is fed to the zero output 8' of the converter. A signal of the first place of the readout code is fed, via a respective input 7 of the device 6, to the first input of the first AND gate 10 of the first functional stage 9. The signals of the second, third, fourth and fifth places of the readout code are fed, via respective inputs 7, to the first inputs of the first AND gates 10 of the functional stages 9 of the second, third, fourth and fifth places and to the second inputs 14 of the first AND gate 10 of the functional stages 9 of the first, second, third and fourth places. Since there is no one pair of neighboring code places having the unity value in this code combination, zero signals appear at the outputs of the first AND gates 10 of all functional stages 9. These zero signals fed, via the first inputs of the first OR gates 11, to the inputs of the NOT gates 12 of all functional stages 9 result in the appearance of unity (enabling) signals at the first inputs of the second AND gates 13 of all functional stages 9 of the device 6. In this case, all input signals of the device 6 are gated through the second inputs of the second AND gates 13 without any changes to the output 8 of the converter. Upon appearance at the output of the device 3 of the combination of binary signals 1 1 0 1 0 0 belonging with the second type, that is containing unity signals in the fifth and fourth places of the selected code, a unity signal appears at the output of the first AND gate 10 of the functional stage 9 of the fourth place. This unity signal results, via the first input of the first OR gate 11 of the fourth functional stage 9, in the appearance of a unity signal at the output of the OR gate 11. This signal fed, via the second inputs 15 of the first OR gates 11 of all functional stages 9 lower with respect to the fourth stage, results in the appearance of unity signals at the outputs of the first OR gates 11 of all functional stages 9 lower with respect to the fourth stage. The unity signals at the outputs of the first OR gates 11 of all functional stages 9 from the fourth to the first one are inverted upon passing through respective NOT gates 13 of all functional stages 9 from the fourth to the first one to result in the appearance of zero (inhibit) signals at the first inputs of the second AND gates 13 of the functional stages 9 beginning with the fourth stage 9 to the first stage 9 inclusive. As a result, zero signals appear at the outputs 8 of the converter from the fourth to the first output inclusive independent on the values of signals in this places of the readout code. The signal at the fifth output 8 coincides with the signal value in this place of the readout code. As a result, the code combination 1 0 0 0 0 0 appears at the outputs 8, which corresponds to a minimal form of the Fibonacci 1-code of the number eight (N=8) which is the number of the quantitized level corresponding to the vertical code strip 39 (FIG. 2).

Therefore, using the device 6 (FIG. 1) during the conversion of an analog value into the Fibonacci p-code, the readout code combination is converted into a minimal form of the Fibonacci p-code. In addition, the error due to ambiguous readout of code is automatically eliminated in the places lower with respect to the identified group of neighboring unity places.

The converted code combination is fed from the outputs 8 of the device 6 to the input of the device 16 for checking the converted code combination of binary signals as to compliance with the minimality criterion of the Fibonaccip-code. The check is effected by testing the presence of more than one unity in the converted code combination of binary signals in any group of p+1 (two with p=1) of sequentially appearing places. Any group of p+1 (two with p=1) sequentially appearing places, e.g. from the ith to the (i−p)th (from the ith to the (i−1)th in this case) is checked by means of the functional stage 19 corresponding to the ith place, wherein i=1,2,3,4,5.

Upon appearance at the output of the device 16 of the combination of binary signals 0 1 0 0 0 0 complying with the minimality criterion of the Fibonacci 1-code, that is not containing two unity signals in any group of two neighboring binary places, the following will occur. A unity signal at the fourth output of the device 16 is fed to one of the inputs of the AND gate 21 of the fourth stage 19. If there is no unity signal at the third input of the device 16, a zero signal appears at the output of the second OR gate 20 of the fourth stage 19, which functions as signal channel with p=1. This zero signal is fed, via the second input 22 of the AND gate 21 of the fourth stage 19, to result in the appearance of a zero signal at the output of the AND gate 21 of the fourth functional stage 19. This indicates to the absence of error in the code group of the fourth and third places. In case zero signals appear at the outputs of all functional stages 19, they are fed, via the inputs 23 of the OR gate 18, to the check output 17 of the converter. This means that there are no errors in the converted code combination.

In case a unity signal appears at the fourth input of the device 6 and a unity signal simultaneously appears at the third input of the device 16 (failure to comply with the minimality criterion of the Fibonacci 1-code), a unity signal appears at the output of the OR gate 20 of the fourth functional stage 19. This unity signal is fed, via the AND gate 21 of the same stage 19, to result in the appearance of a unity signal at the output of the fourth stage 19. Thus a unity signal appears at one of the inputs of the OR gate 18 and at the check output 17 of the converter thus indicating to an error in the converted code combination of binary signals.

During conversion of an electrical value into a Fibonacci p-code, the electrical value being converted is fed to the input 2 (FIG. 1) of the converter coupled to the horizontal deflection plates 49 of the cathode ray tube 47. As a result, the electron beam is deflected from the origin 45 (FIG. 2) of the linear code mask 24 applied to the screen 48 of the cathode ray tube 47 towards the reference line 46 at a distance 44 which is proportional to the electrical value being converted. A linear electric signal fed to the input 50 coupled to the vertical deflection plates results in displacement of the electron beam vertically along the reference line 46. Since the hatched code areas of the code mask 24 do not gate the electron beam through, and the unhatched code areas gate the electron beam through, an electron beam modulated in the distribution of heatched and unhatched code areas intersected by the electron beam appears at the output of the cathode ray tube 47, hence at the output 4 of the device 3. The code readout device 3 receives the modulated electron beam and converts it into a readout code combination appearing at the outputs of the device 3. Further operation of the converter is similar to that described above.

During conversion of an angular motion into a Fibonacci p-code, the angular motion 65 being converted (FIG. 3) is measured from the origin 66 of the code disc 52 to the reference line 67 which may intersect any of the code sectors 54, 55, 69, 70, 71, as well as any of the subsectors 62, 63, 64 of the code sectors 56, 57, 58, 59, 60, 61. The code readout device 3 (FIG. 1) reads the code out from the code disc 52 (FIG. 3), and the readout code combination is fed to the inputs 7 (FIG. 1) of the device 6. Further operation of the converter is similar to that described above, except for the fact that the information at the outputs 8 of the converter is only received from the first five outputs corresponding to message places of the Fibonacci 1-code.

During conversion of a time interval into the Fibonacci 1-code, a signal of the beginning of the time interval is fed to the input 2 (FIG. 4) of the device 1 for realization of the Fibonacci 1-code table and drives the pulse generator 72 to generate at its outputs pulses corresponding to the quantized time interval, which are fed to the input 76 of the time Fibonacci p-code mask generator 75.

The time Fibonacci 1-code mask generator 75 (FIGS. 4, 5) functions in the following manner. Count pulses corresponding to the quantitized time intervals are fed to common inputs 100 and 101 of the functional stage 77 of the first place and to the input 100 of the functional stage of the second place. Before the beginning of conversion, the flip-flops 79 (FIG. 5) of all functional stages 77 are reset which corresponds to the quantized time interval with the number zero. In this case, an inhibit (zero) signal is fed to the input 90 of the second AND gate 89 of the functional stage 77 of the first place from the unity output 80 of the flip-flop 79 of the functional stage 77 of the first place. At the same time, an enabling (unity) signal is fed to the first input of the first AND gate 85 of the functional stage 77 of the first place from the zero output 88 of the flip-flop 79 of the same functional stage 77. An enabling (unity) signal is also fed to the input 99 of the AND gate 85 of the functional stage 77 of the first place from the zero output 88 of the flip-flop 79 of the functional stage 77 of the second place. A first count pulse fed, via the input 101, to the third input of the first AND gate 85 of the functional stage of the first place results in the appearance of a unity signal at the output of the first AND gate 85. This unity signal is fed to the complementing input 86 of the flip-flop 79 of the functional stage 77 of the first place to set it, that is, the time Fibonacci 1-code mask generator is set in the following state:

| 5 | 4 | 3 | 2 | 1 | -places |
|---|---|---|---|---|---------|
| 0 | 0 | 0 | 0 | 1 |         | which corresponds to a minimal form of the Fibonacci 1-code of the number N=1.

In this state, an enabling (unity) signal is fed to the input 90 of the second AND gate 89 of the functional stage 77 of the first place from the output 80 of the flip-flop 79, and an inhibit (zero) signal is fed to the first input 87 of the first AND gate 85 of the same stage from the output 88 of the flip-flop 79 of the same functional stage 77. In this case, a second count pulse fed, via the input 100 of the functional stage 77 of the first place, to the second input of the second AND gate 89 of the same functional stage 77, results in the appearance of a unity signal at the output 102 of the functional stage 77 of the first place. This unity signal is fed, via the input 101 of the functional stage 77 of the second place, the third input 101 of the first AND gate 85 of the functional stage 77 of the second place, and a unity signal at the output thereof will set the flip-flop 79 of the functional stage 77 of the second place so that the generator 75 is set in the following state:

| 4 | 3 | 2 | 1 | -places |
|---|---|---|---|---------|
| 0 | 0 | 1 | 1.|         |

The unity signal appearing at the output of the first AND gate 85 of the second place is also fed to the input 92 of the pulse delay member 91 of the functional stage 77 of the second place to result, in a time τ, in the appearance of a unity signal at the output 94 of the functional stage of the second place. This unity signal is fed, via the input 93 of the OR gate 81 of the functional stage 77 of the first place, to the zero set input 82 of the flip-flop 79 of the functional stage 77 of the first place to reset the flip-flop. Thus, in a time τ, the time Fibonacci p-code mask generator 75 is set in the following state:

| 4 | 3 | 2 | 1 | -places |
|---|---|---|---|---------|
| 0 | 0 | 1 | 0 |         | which corresponds to a minimial form of the Fibonacci 1 -code of the number N=2.

With the generator 75 in the above state, an inhibit (zero) signal is fed to the input 99 of the first functional stage from the output 88 of the second functional stage 77, an inhibit (zero) signal is fed to the first input 87 of the AND gate 85 of the second functional stage 77 (due to the presence of unity in the second place), and an enabling (unity) signal is fed to the input 90 of the AND gate 89 of the functional stage 77 of the second place. Then a third count pulse fed, via the input 100 of the functional stage 77 of the second place, to the input of the AND gate 89 of the same functional stage 77, appears at the output 102 of the functional stage 77 of the second place and, via the input 101 of the AND gate 85 of the functional stage 77 of the third place, sets the flip-flop 79 of the functional stage 77 of the third place. Thus, the time Fibonacci 1-code mask generator 75 is set in the new state:

| 5 | 4 | 3 | 2 | 1 | -places |
|---|---|---|---|---|---------|
| 0 | 0 | 1 | 1 | 0.|         |

A unity signal thus appearing at the output of the AND gate 85 of the functional stage 77 of the third place is fed to the input 92 of the pulse delay member 91 of the same functional stage 77, and a unity signal will appear at the output 94 of the same functional stage 77 in a time τ. This unity signal fed, via the OR gate 81 of the functional stage 77 of the second place, resets the flip-flop 79 of the functional stage 77 of the same place. Then the time Fibonacci 1-code mask generator 75 is set in the new state:

| 5 | 4 | 3 | 2 | 1 | -places |
|---|---|---|---|---|---------|
| 0 | 0 | 1 | 0 | 0 |         | corresponding to a minimal form of the Fibonacci 1-code of the number N=3.

After the arrival to the input 76 of the generator 75 of the sixth pulse, the time Fibonacci 1-code generator 75 is set in the following state:

| 5 | 4 | 3 | 2 | 1 | -places |
|---|---|---|---|---|---------|
| 0 | 1 | 0 | 1 | 0 |         | which corresponds to a minimal form of the Fibonacci 1-code of the number N=6.

In this case, the seventh count pulse fed, via the AND gate 89 of the functional stage 77 of the second place, to the output 102 of the same functional stage and then, via the AND gate 89 of the functional stage 77 of the fourth place, to the output 102 thereof and further, via the AND gate 85 of the functional stage 77 of the fifth place, results in the appearance of a unity signal at the output of the AND gate 85 of the functional stage 77 of the fifth place. This unity signal sets the flip-flop 79 of the functional stage 77 of the fifth place so that the generator 75 is set in a new state:

| 5 | 4 | 3 | 2 | 1 | -places |
|---|---|---|---|---|---------|
| 1 | 1 | 0 | 1 | 0.|         |

This unity signal is fed, via the output 98 of the functional stage 77 of the fifth place, to the input 97 of the functional stage 77 of the second place and then, via the OR gate 83 and the OR gate 81 of the same functional stage 77, to reset the flip-flop 79 of the same functional stage 77. Thus the generator 75 is set in a new state:

| 5 | 4 | 3 | 2 | 1 | -places |
|---|---|---|---|---|---------|
| 1 | 1 | 0 | 0 | 0.|         |

The unity signal at the output of the AND gate 85 of the functional stage 77 of the fifth place is fed, via the pulse delay member 91 of the same stage 77, to the output 94 of the functional stage 77 of the fifth place and then, via the OR gate 81 of the functional stage 77 of the fourth place, resets the flip-flop 79 of the functional stage 77 of the fourth place. As a result, the generator 75 is set in a new state in a time τ:

| 5 | 4 | 3 | 2 | 1 | -places |
|---|---|---|---|---|---------|
| 1 | 0 | 0 | 0 | 0 |         | corresponding to a minimal form of the Fibonacci 1-code of the number N=8.

In the generator 75, (FIG. 4), the outputs 96 of the functional stages 77 of the third, fourth and fifth places are connected to the inputs 95 of the functional stages 77 of the first, second and third places, respectively. This coupling becomes active in the generator 75 with an increase in the number of the functional stages of the generator 75.

Assuming that the generator 75 has nine functional stages 77 and is in the following state:

| 9 | 8 | 7 | 6 | 5 | 4 | 3 | 2 | 1 | -places |
|---|---|---|---|---|---|---|---|---|---------|
| 0 | 0 | 1 | 0 | 1 | 0 | 1 | 0 | 1 |         | which corresponds to a minimal form of the Fibonacci 1-code of the number N=33, a next count pulse fed, via the inputs 100 of the AND gates 89, to the outputs 102 of the functional stages 77 of the first, fifth and seventh places results in the appearance of a unity signal at the output of the AND gate 85 of the functional stage 77 of the eighth place. This unity signal sets the flip-flop 79 of the functional stage 77 of the eighth place so that the generator 75 is set in the following state:

| | 9 | 8 | 7 | 6 | 5 | 4 | 3 | 2 | 1 | -places |
|---|---|---|---|---|---|---|---|---|---|---------|
|N'=| 0 | 1 | 1 | 0 | 1 | 0 | 1 | 0 | 1.|         |

The same unity pulse fed, via the output 98 of the functional stage of the eighth place, and the input 97 of the OR gate 83, to the input of the OR gate 81 of the functional stage of the fifth place resets the flip-flop 79 of the functional stage of the fifth place. Furthermore, a unity signal appearing at the output 96 of the functional stage 77 of the fifth place fed, via the OR gate 70 of the functional stage 77 of the third place and then, via the OR gate 81 of the same functional stage 77, resets the flip-flop 79 of the functional stage 77 of the third place and then, via the output 96 of the same functional stage 77 and the input 95 of the functional stage 77 of the first place, also resets the flip-flop 79 of the functional stage 77 of the first place.

The generator 75 is thus set in a new state:

| 9 | 8 | 7 | 6 | 5 | 4 | 3 | 2 | 1 | -places |
|---|---|---|---|---|---|---|---|---|---------|
| 0 | 1 | 1 | 0 | 0 | 0 | 0 | 0 | 0.|         |

The unity signal at the output of the AND gate 85 of the functional stage 77 of the eighth place is fed, via the pulse delay member 91 of the same stage 77, to the input 93 of the functional stage 77 of the seventh place in a time τ to reset the flip-flop 79 of the functional stage 77 of the seventh place, and the new state of the generator 75 is as follows:

| 9 | 8 | 7 | 6 | 5 | 4 | 3 | 2 | 1 | -places |
|---|---|---|---|---|---|---|---|---|---------|
| 0 | 1 | 0 | 0 | 0 | 0 | 0 | 0 | 0 |         | which corresponds to a minimal form of the Fibonacci 1-code of the number 34.

Therefore, the change in states in the time Fibonacci 1-code mask generator 75 completely corresponds to the change in code combinations in the Fibonacci 1-code table. Signals of the state of the generator 75 are fed, via the message outputs 78 of the functional stages 77 of all places, to the inputs of respective gates (not shown) of the code readout device 3 (FIG. 1). A code readout pulse appears at the input 5 of the converter at the moment of the end of the time interval, and, via the remaining inputs of the gates of the code readout device 3, this pulse results in the appearance of the readout combination of binary signals, at the inputs 7 of the device 6 for conversion of the readout code combination into a minimal form of the Fibonacci 1-code.

Further operation of the converter is as described above.

What is claimed is:

1. An analog-Fibonacci p-code converter comprising:
 a device for realization of a Fibonacci p-code table comprising an ordered sequence of n-place combinations of binary signals corresponding to minimal forms the Fibonacci p-code of numbers from zero to $\phi_p(n)-1$, wherein $\phi_p(n)$ is the Fibonacci p-number, and two combinations of binary signals corresponding to a quantitized analog value with the serial number N are located between combinations of binary signals corresponding to minimal forms of the Fibonacci p-code of numbers N−1 and N differing in more than one place, the first combination differing from the combination of binary signals corresponding to a minimal form of the Fibonacci p-code of the number N−1 in the high order place of non-coincident digits of the combinations of binary signals corresponding to minimal forms of the Fibonacci p-codes of the numbers N−1 and N, and the second combination differing from the combination of binary signals corresponding to a minimal form of the Fibonacci p-code of the number N in the low order place nearest to the high order place of non-coincidient places of the combinations of binary signals corresponding to minimal forms of the Fibonacci p-codes of the numbers N−1 and N, the device having an input receiving the analog value being converted, and a plurality of message outputs whose number is equal to the number of places in the Fibonacci p-code;

a code readout device having a first control input, a plurality of message inputs and a plurality of message outputs corresponding to places of the Fibonacci p-code; a first control input of said code readout device receiving a code readout pulse; a plurality of message inputs of said code readout device being coupled to said device for realization of the Fibonacci p-code table; the message outputs corresponding to places of the Fibonacci p-code from 0 (p−1)th of said plurality of message outputs of said code readout device being message outputs of said analog-Fibonacci p-code converter corresponding to places of the Fibonacci p-code from 0 to (P−1)th;

a device for conversion of a binary code corresponding to the quantitized analogue value into a minimal form of the Fibonacci p-code of the serial number of the quantitized analogue value having a plurality of inputs and a plurality of outputs which are message outputs of said analog-Fibonacci p-code converter corresponding to places of the Fibonacci p-code beginning with the pth place; the plurality of inputs of said device for conversion of binary code being connected to the outputs of the code readout device corresponding to places of the Fibonacci p-code, beginning with the pth place; a plurality of similar functional stages for identification of a pair of neighboring unity places in the selected combination of binary signals, whose number is equal to the number of places of the Fibonacci p-code, beginning with the pth place; a functional stage corresponding to an ith place of said plurality of the functional stages; a first AND gate of said functional stage having a first input, a second input and an output connected with the first input to the ith output of said code readout device, beginning with i=p, with the second input, to the (i=1)th output of said code readout device, beginning with i=p; an OR gate of said functional stage corresponding to the ith place having a first input, a second input and an output, the first input being connected to the output of said first AND gate and the output being connected to the second output of the OR gate of the functional stage corresponding to the (i−1)th place; a NOT gate of said functional stage having an input and an output, the input being connected to the output of said OR gate; a second AND gate of said functional stage corresponding to the ith place having a first input, a second input and an output which is the ith message output of said analog-Fibonacci p-code converter, beginning with i=p, the first input being connected to the output of said NOT gate, the second input being connected to the first input of said first AND gate;

a device for checking the converted code combination of binary signals corresponding to a minimal form of the Fibonacci p-code having a plurality of inputs and an output which is a check output of said analog Fibonacci p-code converter, the inputs being connected to the outputs of said code readout device and to the outputs of said device for conversion of binary code into a minimal form of the Fibonacci p-code; a first OR gate of said checking device having an input and an output which is the check output of said analog-Fibonacci p-code converter; a plurality of similar functional stages of said checking device corresponding to predetermined places of the Fibonacci p-code, beginning with the pth place; the functional stage of said plurality of functional stages corresponding to an ith place of the Fibonacci p-code; a second OR gate of said functional stage corresponding to the ith place of the Fibonacci p-code having p inputs which are the inputs of said checking device corresponding to places of the Fibonacci p-code from the (i−1)th to the (i−p)th place; an AND gate of said functional stage corresponding to the ith place of the Fibonacci p-code having a first input, a second input and an output, the first input being connected to the output of said second AND gate of the ith functional stage of said device for conversion of the readout combination of binary signals which corresponds to the quantitized analog value into a minimal form of the Fibonacci p-code of the serial number of said quantitized analogue value, the second being connected to the output of said second OR gate of the functional stage corresponding to the ith place of the Fibonacci p-code, and the output being connected to a respective input of said fist OR gate of the checking device.

2. A converter according to claim 1, wherein, for conversion of linear motions into the Fibonacci p-code, said device for realization of the Fibonacci p-code table comprises:

a source of linear motions;

a linear code mask which is mechanically coupled to said source of linear motions; horizontal code strips of said code mask corresponding to places of the Fibonacci p-code; vertical code strips of said linear code mask corresponding to the Fibonacci p-code of numbers from zero to $\phi_p(n)-1$; code areas of said code mask defined by the intersection of said horizontal code strips and vertical code strips, the code areas having a pre-set channel capacity for a code readout pulse, the distribution of channel capacity of the code areas of the mask for a code readout pulse corresponding to the distribution of zeroes and unities in said Fibonacci p-code table.

3. A converter according to claim 1, wherein, for conversion of electrical values into the Fibonacci p-code, the device for realization of the Fibonacci p-code table comprises:

a cathode ray tube; an input of said cathode-ray tube receiving an electrical value being converted; a screen of said cathode ray tube; a linear code mask applied to the screen of said cathode ray tube; horizontal code strips of said code mask corresponding to places of the Fibonacci p-code, vertical code strips of said linear code mask corresponding to the Fibonacci p-code of numbers from zero to $\phi_p(n)$; code areas defined by the intersection of said horizontal code strips and vertical code strips having a pre-set channel capacity for an electron beam, the distribution of channel capacity for an electrone beam of the code areas of the mask corresponding to the distribution of unities and zeroes of said Fibonacci p-code table of said code mask.

4. A converter according to claim 1, wherein, for conversion of angular motions into the Fibonacci p-code, the device for realization of the Fibonacci p-code table comprises:

a source of angular motions; a code disc which is mechanically coupled to the source of angular motions; a plurality of concentric code rings of said code disc corresponding to respective places of the Fibonacci p-code; a plurality of code sectors of said code disc corresponding to the Fibonacci p-code of numbers from zero to $\phi_p(n)$; code areas defined by the intersection of said pluralities of the concentric code rings and code sectors having a pre-set channel capacity for a code readout pulse, the distribution of channel capacity for a code readout pulse on said code disc corresponding to the distribution of unities and zeroes in said Fibonacci p-code table.

5. A converter according to claim 4, wherein said code disc comprises:

a concentric code ring adjoining said code ring which corresponds to the high order place of the Fibonacci p-code in said plurality of concentric code rings; three code sectors located between said code sector corresponding to the Fibonacci p-code of the number zero in said plurality of code sectors and the code sector which corresponds to the Fibonacci p-code of the number $\phi_p(n)-1$ of said group of code sectors; code areas defined by the intersection of said code ring and said three code sectors having a channel capacity for a code readout pulse corresponding to the unity value of a place of the Fibonacci p-code; code areas defined by the intersection of said code ring and said plurality of code sectors having a channel capacity for a code readout pulse corresponding to the zero value of a place of the Fibonacci p-code; the distribution of channel capacity for a code readout pulse of the code areas defined by the intersection of said plurality of code rings and one of said three code sectors adjoining the code of said plurality of code sectors which corresponds to the Fibonacci p-code of the number $\phi_p(n)-1$ coinciding with the distribution of channel capacity for a code readout pulse of code areas defined by the intersection of said plurality of code rings and the code sector of said plurality of code sectors; which corresponds to the Fibonacci p-code of the number $\phi_p(n)-1$; the distribution of channel capacity for a code readout pulse of code areas defined by the intersection of said plurality of code rings of one of said three code sectors adjoining the code sector corresponding to the Fibonacci p-code of the number zero coinciding with the distribution of channel capacity for a code readout pulse of code areas defined by the intersection of said plurality of code rings and the code sector of said plurality of code sectors which corresponds to the Fibonacci p-code of the number zero; the distribution of channel capacity for a code readout pulse of code areas defined by the intersection of said plurality of code rings and one of said three code sectors coinciding with the distribution of channel capacity for a code readout pulse readout pulse of code areas defined by the intersection of said plurality of code rings and one of said three code sectors adjoining the code sector of said plurality of code sectors which corresponds to the Fibonacci p-code of the number zero, except for code areas defined by the intersection of said code sectors and the code ring of said plurality of code rings which corresponds to the high order place of the Fibonacci p-code.

6. A converter according to claim 1, wherein, for conversion of time intervals into the Fibonacci p-code, the device for realization of the Fibonacci p-code table comprises:

a pulse generator generating pulses corresponding to a respective quantitized time interval having an input and an output, the input receiving a signal of the beginning of the time interval;

said code readout device having a control input receiving a signal of the end of the time interval which is the code readout pulse;

a zero bus connected to the message inputs of said code readout device corresponding to places of the Fibonacci p-code from zero to $(p-1)$th;

a time Fibonacci p-code mask generator; a plurality of similar functional stages of said time Fibonacci p-code mask generator whose number is equal to the number is equal to the number of places of the Fibonacci p-code, beginning with the pth place; a functional stage corresponding to an ith place of the Fibonacci p-code; a flip-flop of said functional stage having a zero set input, a complementing input, a unity output and a zero output, the unity output being connected to the input of said code readout device corresponding to the ith place of the Fibonacci p-code, beginning with $i=p$; a first OR gate of said functional stage having a first input, a second input and an output, the output being connected to the zero set input of said flip-flop of the same ith functional stage; a second OR gate of said functional stage having a first input, a second input and an output, the first input being connected to the output of the second OR gate of the functional stage corresponding to the $(i-p-1)$th place of the Fibonacci p-code and the output being connected to the first input of said first OR gate of the same ith functional stage; and the first AND gate of said functional stage having $p+2$ inputs and an output, a first input being connected to the zero output of the flip-flop of the same ith functional stage, the inputs from the second to the $(p+1)$th being connected to the second zero outputs, respectively, of the flip-flops, of said functional stages corresponding to places of the Fibonacci p-code from the $(i+1)$th to $(i+p)$th, the output being connected to the complementing input of said flip-flop of the same ith functional stage and to the second input of the second OR gate of the functional stage corresponding to the $(i-p-2)$th place of the Fibonacci p-code; a second AND gate of said ith functional stage having a first input, a second input and an output, the first input being connected to the unity output of said flip-flop of the same ith functional stage, the second input being connected to the (p+2)th input of said first AND gate of the functional stage corresponding to the (i−1)th place of the Fibonacci p-code and to the output of said second AND gate of the functional stage corresponding to the (i−p−1)th place of the Fibonacci p-code; a pulse delay member having an input and an output, the input being connected to the output of said first AND gate of the same ith functional stage and the output being connected to the second input of said first OR gate of the functional stage corresponding to the (i−1)th place of the Fibonacci p-code; the second input of said second AND gate of the functional stage corresponding to the pth place of the Fibonacci p-code being connected to the (p+2)th input of the first AND gate of the functional stage of the same place and to the output of said pulse generator.

* * * * *